(12) United States Patent
Bult

(10) Patent No.: US 8,223,494 B2
(45) Date of Patent: Jul. 17, 2012

(54) CONDUCTION COOLED CIRCUIT BOARD ASSEMBLY

(75) Inventor: Jeff Bult, Grand Rapids, MI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 11/968,104

(22) Filed: Dec. 31, 2007

(65) Prior Publication Data

US 2011/0141692 A1 Jun. 16, 2011

(51) Int. Cl.
*H05K 7/20* (2006.01)
(52) U.S. Cl. .............. 361/700; 165/104.33; 361/719
(58) Field of Classification Search .............. 361/700
See application file for complete search history.

(56) References Cited

U.S. PATENT DOCUMENTS

| | | | |
|---|---|---|---|
| 4,366,526 A | 12/1982 | Lijoi et al. | |
| 4,716,498 A * | 12/1987 | Ellis | 361/715 |
| 4,777,561 A | 10/1988 | Murphy et al. | |
| 4,916,575 A * | 4/1990 | Van Asten | 361/715 |
| 5,859,764 A * | 1/1999 | Davis et al. | 361/704 |
| 5,999,407 A * | 12/1999 | Meschter et al. | 361/704 |
| 6,246,582 B1 * | 6/2001 | Habing et al. | 361/704 |
| 6,411,512 B1 | 6/2002 | Mankaruse et al. | |
| 6,621,713 B2 * | 9/2003 | Amaike et al. | 361/797 |
| 6,721,182 B1 * | 4/2004 | Wells et al. | 361/704 |
| 6,788,537 B2 | 9/2004 | Saita et al. | |
| 6,804,117 B2 | 10/2004 | Phillips et al. | |
| 6,839,235 B2 * | 1/2005 | St. Louis et al. | 361/700 |
| 6,914,780 B1 * | 7/2005 | Shanker et al. | 361/679.47 |
| 7,193,850 B2 | 3/2007 | Pal | |
| 7,319,588 B2 | 1/2008 | Peng et al. | |
| 7,345,877 B2 | 3/2008 | Asfia et al. | |
| 7,397,662 B2 * | 7/2008 | Oyamada | 361/699 |
| 2006/0109631 A1 * | 5/2006 | Marro et al. | 361/718 |
| 2007/0034360 A1 | 2/2007 | Hall | |

OTHER PUBLICATIONS

Unofficial translation of Chinese Office Action from coorresponding CN Patent Application No. 200810188742.6 on Jul. 4, 2011.

* cited by examiner

*Primary Examiner* — Gregory Thompson
(74) *Attorney, Agent, or Firm* — General Electric Company; William Scott Andes

(57) ABSTRACT

A conduction cooled circuit board assembly may include a frame and at least one circuit board attached to the frame, having at least one area to be cooled. The assembly may also include at least one rail attached to the frame, and at least one heat pipe having a first end and a second end, the first end disposed near the area and the second end in contact with the rail so as to transfer heat from the area to the rail.

6 Claims, 6 Drawing Sheets

CONDUCTION COOLED CIRCUIT BOARD ASSEMBLY

BACKGROUND OF THE INVENTION

The exemplary embodiments relate generally to electronic components and more specifically to a circuit board assembly having one or more heat pipes to enhance cooling of the circuit board.

In avionics and other applications, printed circuit boards ("PCBs") are commonly mounted within a chassis. The heat generated by electronic devices associated with the PCB may be dissipated by transfer to a metal wall of the chassis through the PCBs. The heat may then be sent to an external heat sink by conduction through the chassis wall, and is finally taken away by either cool air circulating about the heat sink or a cold plate. Because of high thermal resistance in the heat transfer path, the temperature generally increases with continued operation until steady state is reached. This leads to a larger temperature gradient between the electronic devices that are generating heat and the heat sink. This larger temperature gradient may adversely affect the performance of the electronic devices.

Heat pipes have been used to assist in the transfer of heat from the PCBs. A typical heat pipe may be made of a sealed hollow tube. The tube may be made of a conductive metal such as copper or aluminum. The tube contains a relatively small quantity of a fluid (such as water, ethanol or mercury) with the remainder of the tube being filled with the vapor phase of the fluid, all other gases being excluded. Disposed within the tube, a wick structure exerts a capillary force on the liquid phase of the fluid. This may typically be a sintered metal powder or a series of grooves parallel to the tube axis, but it may be any material capable of soaking up the coolant. If the heat pipe is placed in an arrangement so that it has a continual slope with the heated end down, no inner lining is needed. The working fluid simply flows with gravity back down the tube.

Heat pipes employ evaporative cooling to transfer thermal energy from one point to another by the evaporation and condensation of the fluid. Heat pipes rely on a temperature difference between the ends of the pipe, and cannot lower temperatures at either end beyond the temperature of the cool end. When one end of the heat pipe is heated the fluid inside the pipe at that end evaporates and increases the vapor pressure inside the cavity of the heat pipe. The latent heat of evaporation absorbed by the vaporization of the fluid removes heat from the hot end of the pipe. The vapor pressure at the hot end of the pipe is higher than the equilibrium vapor pressure at the cooler end of the pipe, and this pressure difference drives a rapid mass transfer to the condensing end where the vapor condenses, releases its latent heat, and transfers heat to the cool end of the pipe. The condensed fluid then flows back to the hot end of the pipe. In the case of vertically-oriented heat pipes, the fluid may be moved by the force of gravity. In the case of heat pipes containing wicks, the fluid may be returned by capillary action.

As PCB performance and power increase, so does the temperature generated by the PCBs. The largest increases in temperature may occur between the chassis wall and the PCB edge, and between the PCB edge and the PCB center. Previous assemblies have not been adequate in dissipating the increased heat generated by higher power PCBs. These assemblies have conducted heat away through poor conductive paths such as the circuit board itself, and/or through clamping devices that secure the assemblies to the chassis.

BRIEF DESCRIPTION OF THE INVENTION

In one exemplary embodiment, a conduction cooled circuit board assembly may include a frame and at least one circuit board attached to the frame, having at least one area to be cooled. The assembly may also include at least one rail attached to the frame, and at least one heat pipe having a first end and a second end, the first end disposed near the area and the second end in contact with the rail so as to transfer heat from the area to the rail.

In another exemplary embodiment, a conduction cooled circuit board assembly associated with a chassis may include a frame having a first surface in contact with the chassis, at least one circuit board attached to the frame having at least one area to be cooled, and at least one rail attached to the frame, where heat is conducted from the area to the chassis through the frame and the first surface.

In yet another exemplary embodiment, a conduction cooled circuit board assembly associated with a chassis may include a frame having a protrusion having a first surface in contact with the chassis and at least one circuit board attached to the frame, the circuit board including at least one area to be cooled and a cutout for receiving said protrusion. The assembly may further include at least one rail attached to the frame and having a second surface in contact with the chassis; and at least one heat pipe having a first end and a second end, the first end disposed near the area and the second end in contact with the rail so as to transfer heat from the area to the rail and from the rail to the chassis through the second surface.

DETAILED DESCRIPTION OF THE INVENTION

Figure 1:
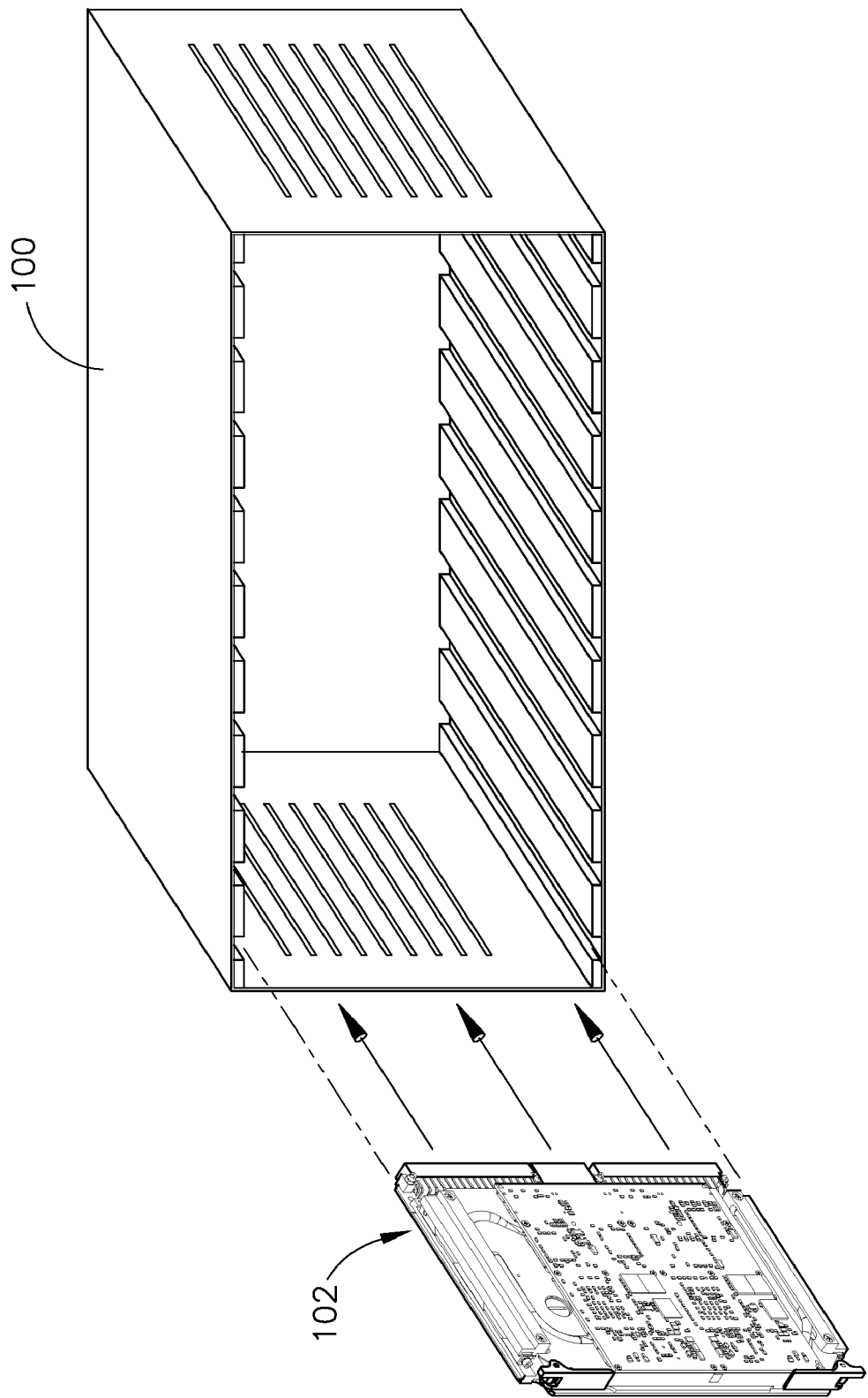
FIG. 1 is perspective view of a chassis of one exemplary embodiment that may house one or more printed circuit boards.
Figure 2:
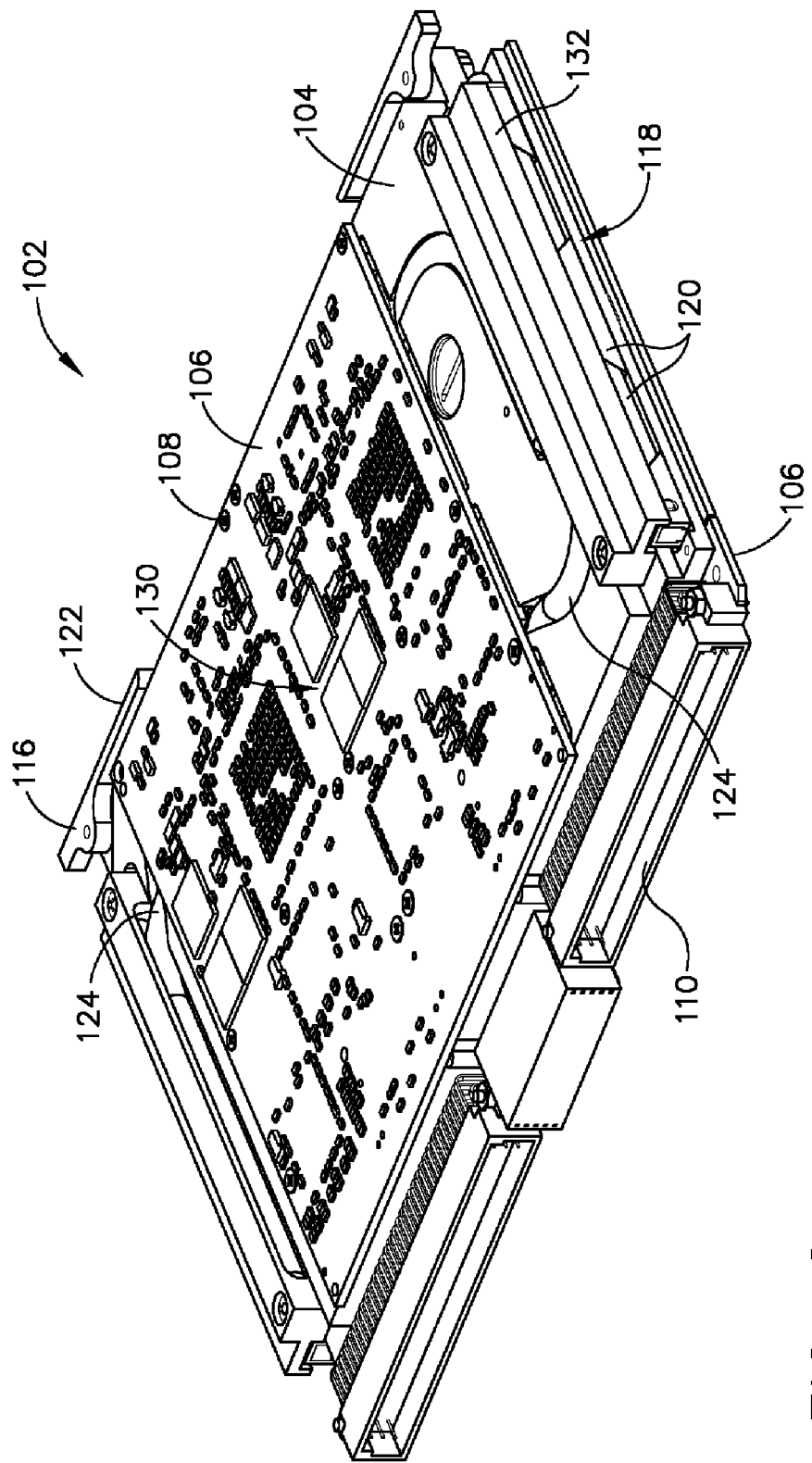
FIG. 2 is a perspective view of one exemplary embodiment of a circuit board assembly.
Figure 3:
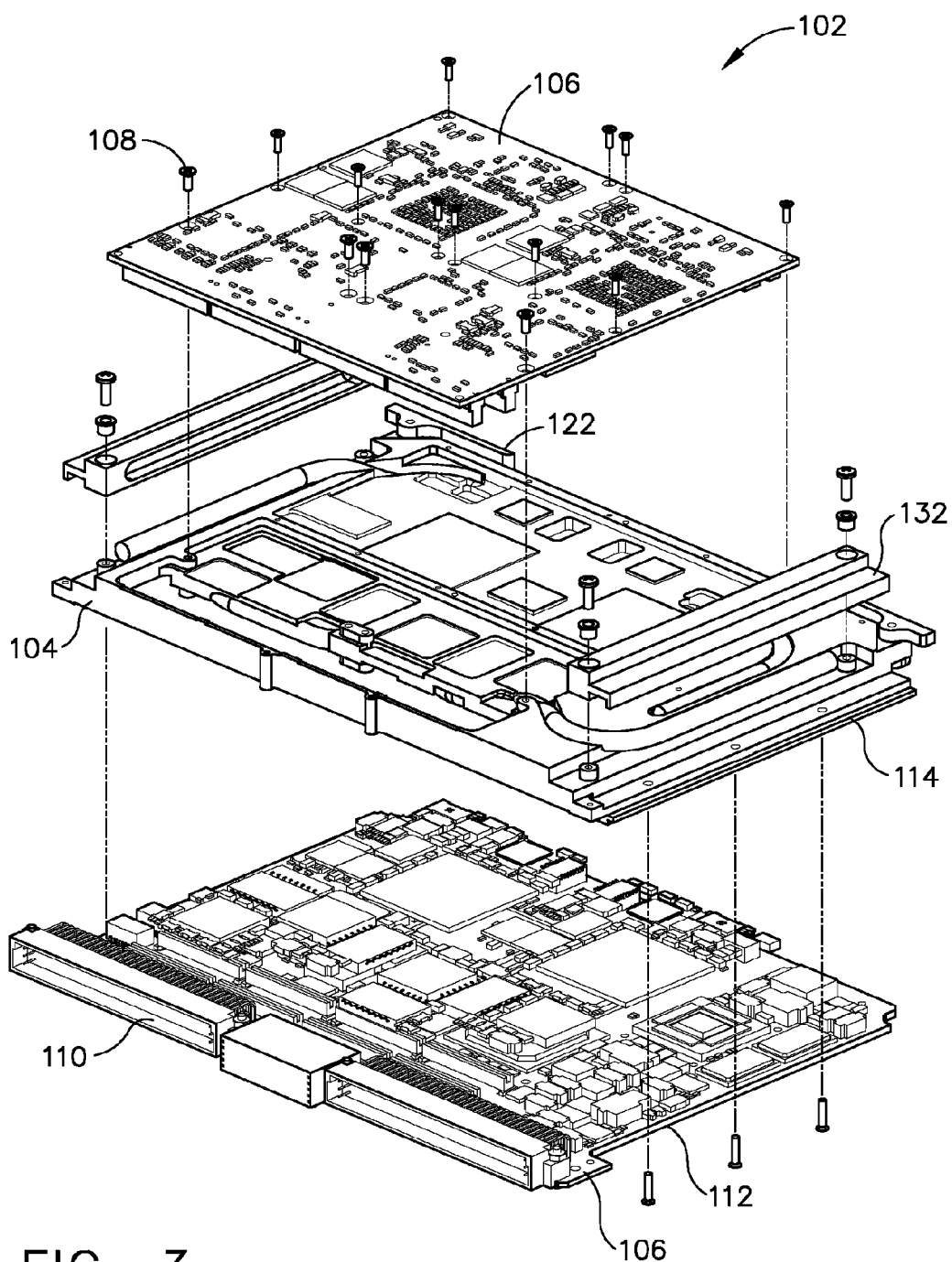
FIG. 3 is a partially exploded perspective view of one exemplary embodiment of a circuit board assembly.

FIG. 1 is a perspective view of one exemplary embodiment of a chassis 100 having a circuit board assembly 102 associated therewith. The chassis 100 may be included as part of an avionics package for an aircraft (not shown) or other similar environment. The circuit board assembly is shown in more detail in FIGS. 2-5. FIG. 2 is a perspective view and FIG. 3 is a partially exploded perspective view of one exemplary embodiment of a circuit board assembly 102. The circuit board assembly 102 may have a frame 104. The frame 104 may be made of any material or combination of materials that may be thermally conductive, such as, but not limited to, aluminum, copper, composites or any combination thereof. The frame 104 may serve as the mechanical support for all other components of the circuit board assembly 102. One or more circuit boards 106 may be attached to the frame 104 in any manner known in the art, such as, but not limited to, mechanical fasteners 108, adhesives, etc. The circuit boards 106 may have a plurality of integrated circuits and/or other electronic components as will be known to one of ordinary skill in the art. The circuit boards 106 may also have one or more connectors 110, which may connect the circuit boards 106 to other electronic components within the chassis 100. The circuit boards 106 may be connected to the frame 104 in any arrangement, for example and as shown in FIGS. 2 and 3, the circuit boards 106 may be arranged so that one is above the frame 104 and one is below the frame 104. In one exemplary embodiment, one or more of the circuit boards 106 may have one or more cutouts 112 that may cooperate with protrusions 114 that may extend from the frame 104 so that a surface 148 of the frame 104 may be in contact with the chassis 100. An attachment mechanism 116 may be connected to the frame 104 for securing the circuit board assembly 102 to the chassis 100. In one exemplary embodiment, as shown in FIGS. 2-6, the attachment mechanism 116 may be a clamping device 118. The clamping device 118 may be made up of a plurality of trapezoidal-shaped wedges 120 and one or more clamps 122. The clamps 122 may cooperate with the wedges 120 to lock the circuit board assembly 102 in place when installed into the chassis 100. Any attachment mechanism known in the art may be used.

Figure 4:
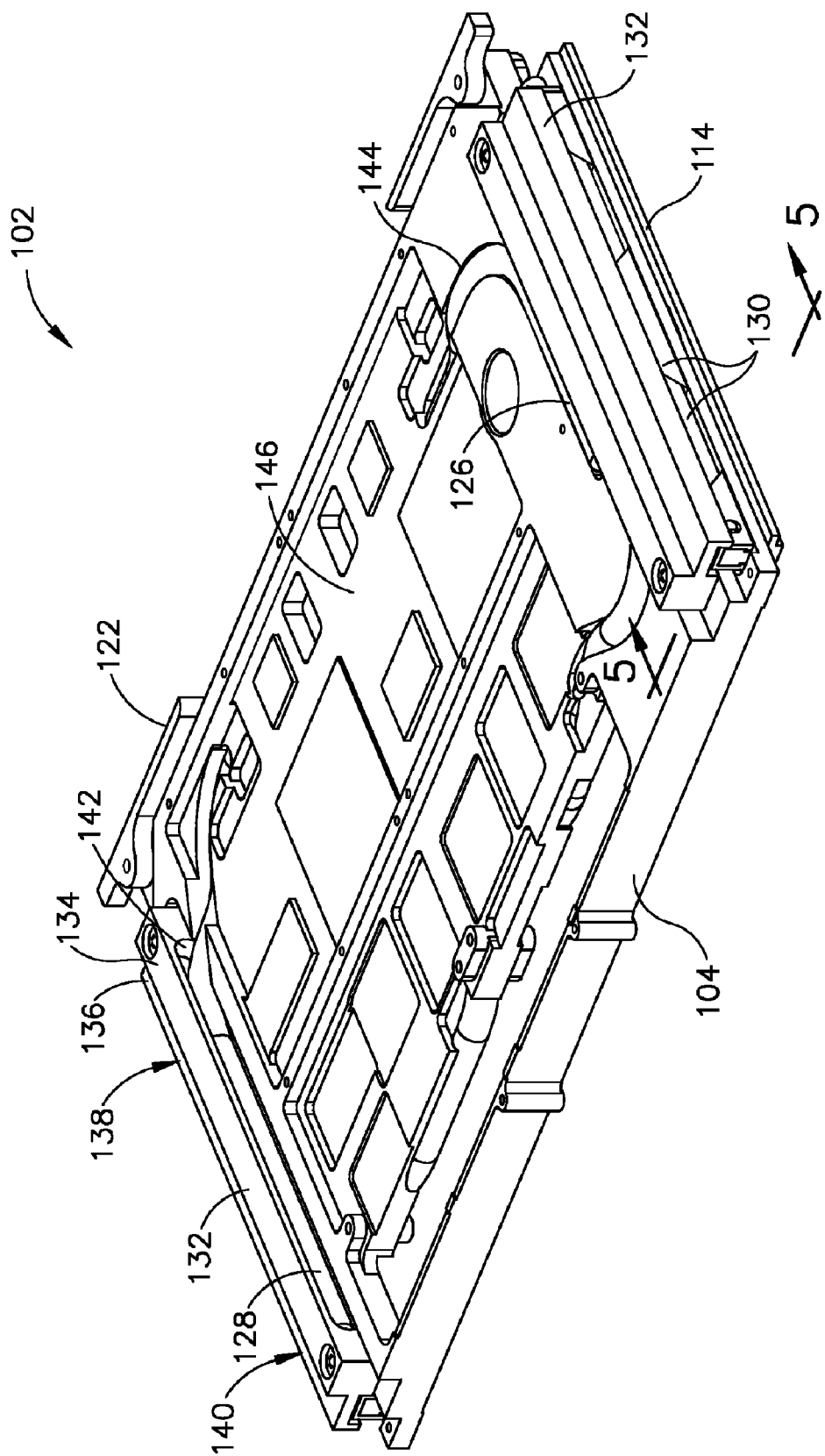
FIG. 4 is a perspective view of one exemplary embodiment of a circuit board assembly, shown with the printed circuit boards removed.
Figure 5:
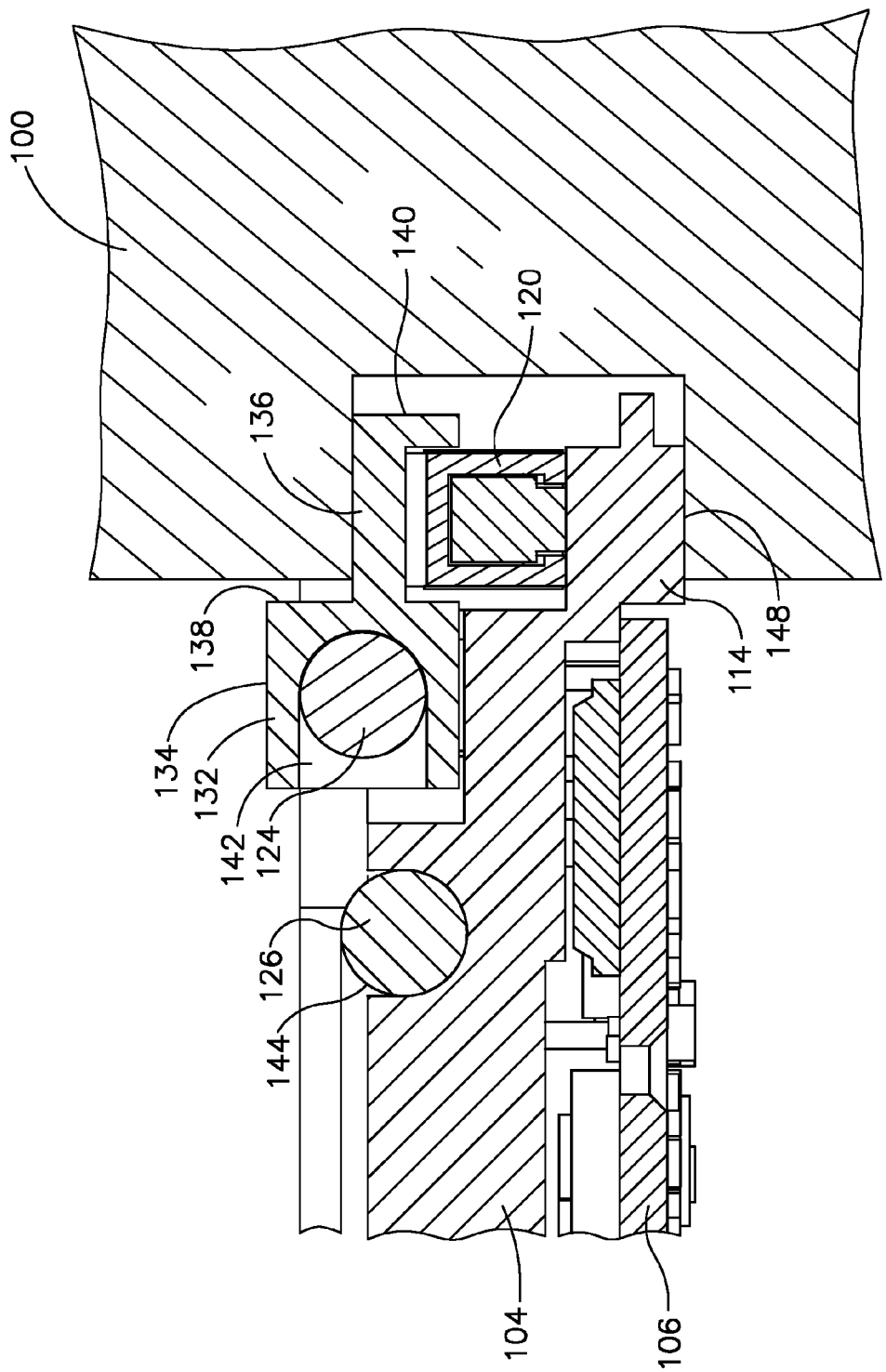
FIG. 5 is a cross-sectional view along line 5-5 in FIG. 4 of one exemplary embodiment of a circuit board assembly.
Figure 6:
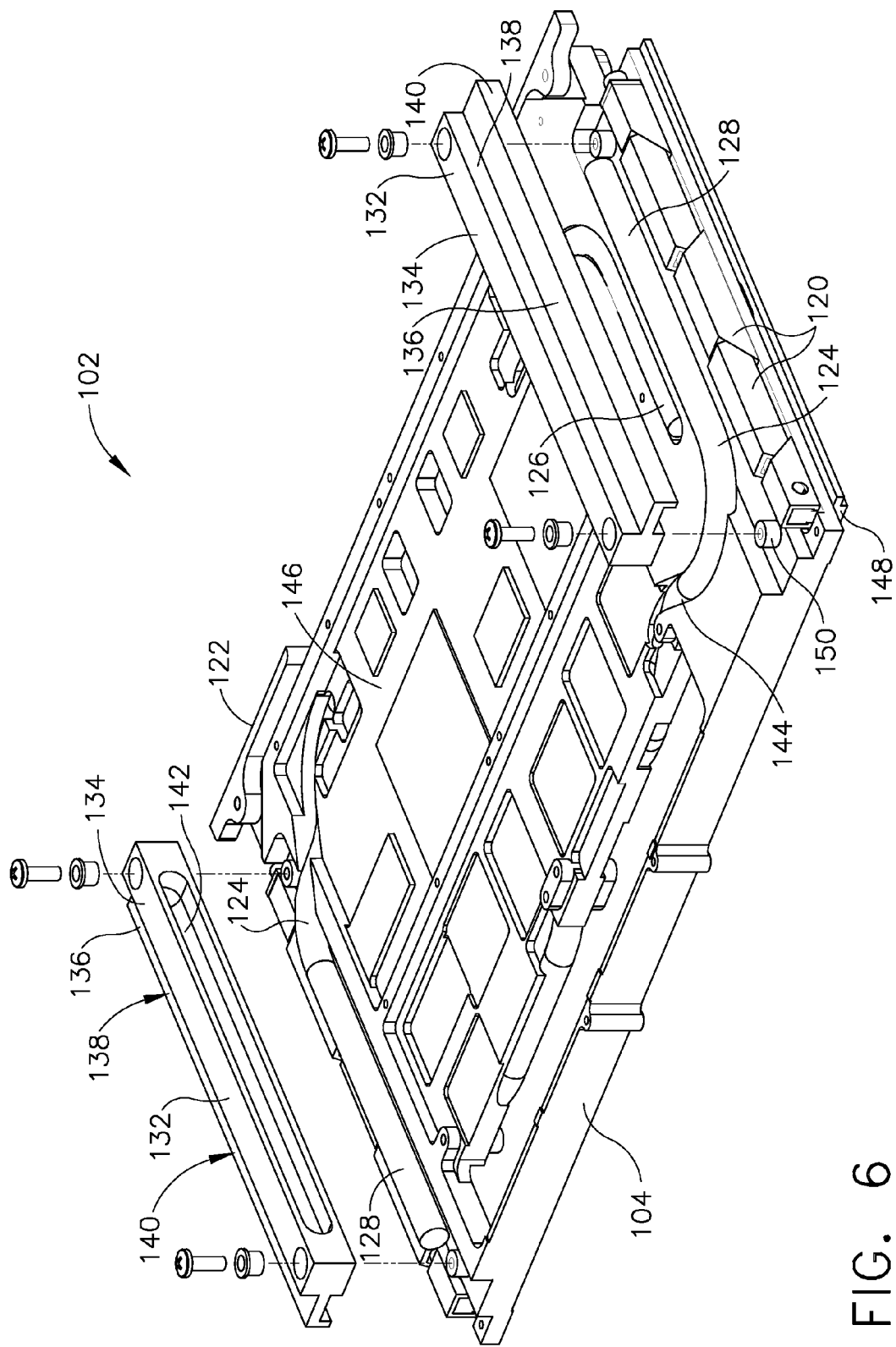
FIG. 6 is a partially exploded perspective view of one exemplary embodiment of a circuit board assembly, shown with the printed circuit boards removed.

FIG. 4 is a perspective view and FIG. 6 is a partially exploded perspective view of one exemplary embodiment of a circuit board assembly 102, shown with the circuit boards 106 removed for clarity. FIG. 5 is a cross-sectional view taken along line 5-5 in FIG. 4. The circuit board assembly 102 may have a heat pipe 124. The heat pipe 124 may be any heat pipe known in the art, any size and configuration of a heat pipe and any number of heat pipes may be used. The heat pipe 124 may have a first end 126 and a second end 128. In one exemplary embodiment, the first end 126 may be placed near an area 130 in need of cooling on the circuit board assembly 102. The area 130 of the circuit board assembly 102 may be any sized area in need of cooling. There may be more than one area 130 of the circuit board assembly 102. The second end 128 may be placed near or in contact with a rail 132 that may be included in the circuit board assembly 102. In one exemplary embodiment, a plurality of rails 132 may be used. The rail 132 may be made of any material that may be thermally conductive, such as, but not limited to, aluminum. The rail 132 may be attached to the frame 104 or may be attached to another component of the circuit board assembly 102 and in contact with the frame 104. In one exemplary embodiment, as shown in FIG. 5, the rail 132 may float on one or more pedestals 150. This may allow the rail 132 to shift position when the circuit board assembly 102 is secured within the chassis 100 with the attachment mechanism 116.

The rail 132 may have a plurality of surfaces, such as surfaces 134, 136, 138 and 140. One or more of the surfaces 134, 136, 138, and 140 may be in contact with the chassis 100 and/or frame 104. In one exemplary embodiment, as shown in FIG. 5, the surface 136 may be in contact with the chassis 100 for dissipating heat thereto. The rail 132 may also have a depression 142 formed therein, which may be sized and adapted to receive a portion of the heat pipe 124. In one exemplary embodiment, the depression 142 may receive the second end 128 of the heat pipe 124. In another exemplary embodiment, the depression 142 may receive at least half the length of the heat pipe 124. The heat pipe 124 may be embedded within the rail 132 so that as much surface contact as possible may be made between the depression 142 and the heat pipe 124. The heat pipe 124 may also be flexible enough to allow it to shift position when the circuit board assembly 102 is secured within the chassis 100.

The one or more circuit boards 106 may generate heat in one or more areas 130. The heat pipe 124 may transfer heat from the area 130 and first end 126 to the second end 128 and rail 132. The rail may transfer heat to the chassis 100, which may then expel the heat outside the chassis 100. The frame 104 may also receive heat on its own or from the heat pipe 124 and transfer heat from one or more areas to the chassis 100, such as through surface 148, shown in FIG. 5. In one exemplary embodiment, the frame may have a depression 144 that may be sized to receive a portion of the heat pipe 124. The heat pipe 124 may be embedded within the rail 132 so that as much surface contact as possible may be made between the depression 144 and the heat pipe 124. In another exemplary embodiment, the heat pipe 124 may be attached to the surface 146 of the frame 104. In one exemplary embodiment, the rail 132 may receive heat through more than the second end 128 of the heat pipe, as the heat pipe 128 may be embedded in the depression 142 formed within the rail 132. Heat may be transferred from the rail 132 through one or more of surfaces 134, 136, 138 and 140 to the chassis 100, such as surface 136 shown in FIG. 5. In one exemplary embodiment, the surfaces 136 and 148 may be parallel. The exemplary embodiments described herein allow heat to be dissipated through good conductive paths, thus lowering the operating temperature of the circuit board assemblies.

While the exemplary embodiments have been described in terms of various specific embodiments, those skilled in the art will recognize that these embodiments can be practiced with modification within the spirit and scope of the claims.

What is claimed is:

1. A conduction cooled circuit board assembly associated with a chassis, comprising:
    a frame having a protrusion having a first surface in contact with said chassis;
    at least one circuit board attached to said frame, said circuit board including at least one area to be cooled and a cutout for receiving said protrusion;
    at least one rail attached to said frame and having a second surface in contact with said chassis; and
    at least one heat pipe having a first end and a second end, said first end disposed near said area and said second end in contact with said rail so as to transfer heat from said area to said rail and from said rail to said chassis through said second surface.

2. The conduction cooled circuit board assembly of claim 1 wherein said first surface and said second surface are parallel.

3. The conduction cooled circuit board assembly of claim 2 wherein said first end is embedded into a depression in said frame.

4. The conduction cooled circuit board assembly of claim 3 wherein said second end is embedded within a depression in said rail.

5. The conduction cooled circuit board assembly of claim 1 wherein said first end is embedded into a depression in said frame.

6. The conduction cooled circuit board assembly of claim 1 wherein said second end is embedded within a depression in said rail.

* * * * *